(12) United States Patent
Watanabe (10) Patent No.: US 7,638,931 B2
(45) Date of Patent: Dec. 29, 2009

(54) RESIN SUBSTRATE AND ULTRASONIC SENSOR USING THE SAME

(75) Inventor: Kazuaki Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 167 days.

(21) Appl. No.: 11/907,300

(22) Filed: Oct. 11, 2007

(65) Prior Publication Data

US 2008/0088206 A1    Apr. 17, 2008

(30) Foreign Application Priority Data

Oct. 13, 2006    (JP)    .............................. 2006-280287

(51) Int. Cl.
*H01L 41/08* (2006.01)
(52) U.S. Cl. ..................................... 310/348
(58) Field of Classification Search ................ 310/348, 310/322, 327, 334, 338, 323.21, 363–366, 310/328, 311; 73/649; 257/783

See application file for complete search history.

(56) References Cited

U.S. PATENT DOCUMENTS

| 4,882,714 A | 11/1989 | Tanigawa |
| 4,896,304 A | 1/1990 | Tanigawa |
| 5,483,106 A * | 1/1996 | Echigo et al. ................ 257/783 |
| 6,924,587 B2 | 8/2005 | Muramatsu et al. |
| 2005/0236938 A1 | 10/2005 | Nakajima |
| 2006/0043843 A1* | 3/2006 | Sugiura et al. ............... 310/348 |

FOREIGN PATENT DOCUMENTS

| JP | A-59-210798 | 11/1984 |
| JP | A-2002-58097 | 2/2002 |
| JP | A-2007-19425 | 1/2007 |

* cited by examiner

*Primary Examiner*—Walter Benson
*Assistant Examiner*—Karen B Addison
(74) *Attorney, Agent, or Firm*—Posz Law Group, PLC

(57) ABSTRACT

An ultrasonic sensor includes a resin substrate and an ultrasonic oscillator. The ultrasonic oscillator is provided approximately at the center of a component side of the resin substrate and generates and detects an ultrasonic wave. The resin substrate is made of, for example, a polycarbonate resin, i.e., the same material as a car bumper, and is shaped into a flat plate. The component side of the resin substrate is provided with a pad 11 adjacent to the ultrasonic oscillator. The pad is used for metal wiring based on wire bonding. The pad is made of a hard metal material excellent in conductivity and heat resistance such as stainless steel, and Al or Al alloy, for example. The resin substrate is formed as a single piece through insert molding by pouring a melted resin. Through this process, the pad is provided for the component side of the resin substrate.

10 Claims, 8 Drawing Sheets

RESIN SUBSTRATE AND ULTRASONIC SENSOR USING THE SAME

CROSS REFERENCE TO RELATED APPLICATION

This application is based on and incorporates herein by reference Japanese Patent Application No. 2006-280287 filed on Oct. 13, 2006.

FIELD OF THE INVENTION

The present invention relates to a resin substrate and an ultrasonic sensor having an ultrasonic oscillator bonded to the resin substrate.

BACKGROUND OF THE INVENTION

As conventionally known, a car (vehicle) is mounted with an ultrasonic sensor including an ultrasonic oscillator bonded to a substrate. The ultrasonic sensor transmits an ultrasonic wave from an element capable of transmitting and receiving ultrasonic waves. The ultrasonic sensor uses the element to receive the ultrasonic wave reflected on an object to be detected. In this manner, the ultrasonic sensor measures a position of an object around the car, a distance between the object and the car, and a two-dimensional or three-dimensional shape of the object.

In a known ultrasonic sensor (Patent Document 1), for example, a substrate is provided at a tip of a cylindrical aluminum case mounted on a vehicle. The substrate is directly mounted with a piezoelectric ultrasonic oscillator for detecting an ultrasonic wave. The substrate is vibrated to transmit and receive an ultrasonic wave.

Patent Document 1: JP-2002-58097 A

This type of ultrasonic sensor is mounted at a position easily identifiable from the outside and needs to be miniaturized for aesthetic purposes. However, miniaturizing the ultrasonic sensor degrades sensor characteristics due to an increased resonance frequency, increased signal attenuation, or degraded directivity. Decreasing the resonance frequency just needs to decrease the rigidity of a substrate where the ultrasonic oscillator is to be bonded. Measures of decreasing the substrate rigidity include the use of a substrate with a low Young's modulus, e.g., a resin substrate.

Figure 10A:
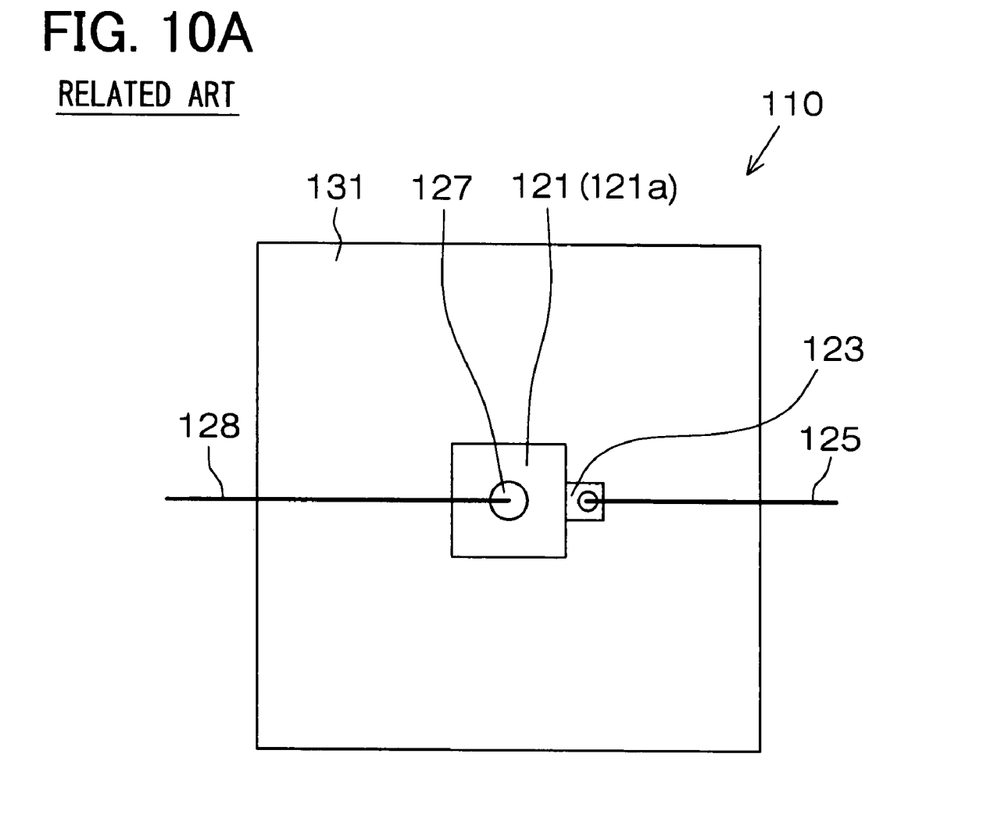
FIGS. 10A and 10B are explanatory diagrams of an ultrasonic sensor in a related art.
Figure 10B:
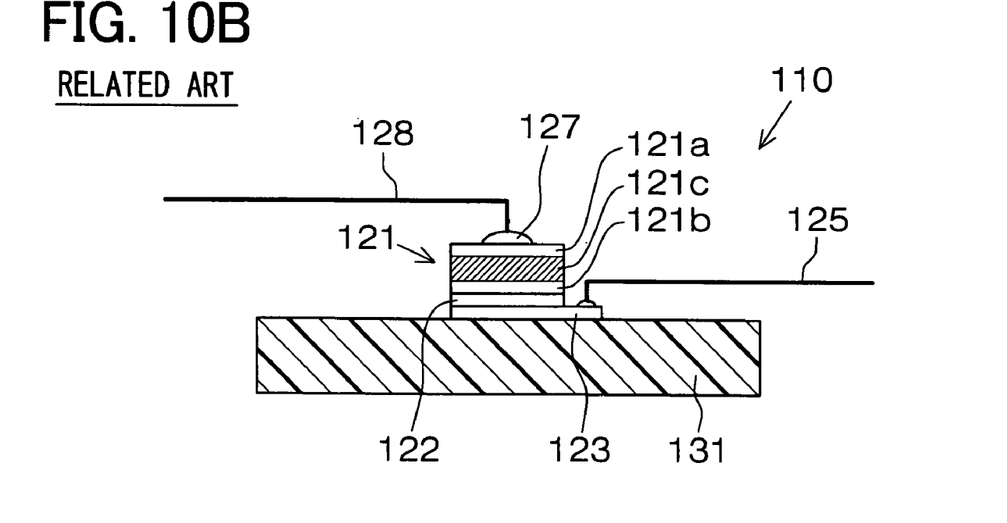

An ultrasonic sensor 110 is formed using a resin substrate. As shown in FIGS. 10A and 10B, the ultrasonic sensor 110 includes a resin substrate 131 and an ultrasonic oscillator 121 formed by sandwiching a piezoelectric substance 121c between an upper electrode 121a a lower electrode 121b. A lead wire 128 is soldered to the upper electrode 121a. A lead wire 125 is soldered to an electrode 123 and electrically coupled with the lower electrode 121b via a conductive adhesive 122.

The ultrasonic oscillator 121 is wired by soldering lead wires to the electrodes. Soldering becomes difficult on the ultrasonic oscillator 121 miniaturized to a square millimeter or smaller. It is preferable to change the wiring method from soldering to wire bonding. Since the resin substrate 131 shows a less heat resistance, however, it cannot bear thermocompression bonding that requires a high temperature of 300 degrees or higher. Since the resin substrate 131 is less rigid, thermosonic bonding (ultrasonic thermocompression bonding) cannot generate a proper frictional heat and is therefore inapplicable. The resin substrate is effective for ultrasonic sensor miniaturization but has been incapable of wiring using the wire bonding.

SUMMARY OF THE INVENTION

It is therefore an object of the present invention to provide a resin substrate capable of wire bonding wiring and an ultrasonic sensor using the resin substrate.

To achieve the above-mentioned object, according to a first example of the present invention, a resin substrate is provided as follows. A resin body is configured using an insert molding and the resin body has a component side for mounting a component. A pad is disposed to the component side of the resin body and provided for wire bonding wiring. Here, the pad is attached to the component side of the resin body through the insert molding.

As another example of the present invention, a resin substrate is provided as follows. A resin body is included and has a component side for mounting a component. A pad is disposed to the component side of the resin body and provided for wire bonding wiring. Here, the pad is bonded to the component side of the resin body.

As yet another example of the present invention, an ultrasonic sensor is provided as follows. An ultrasonic oscillator is included. Either of the above mentioned resin substrates is further included for mounting the ultrasonic oscillator. Here, the ultrasonic oscillator and the pad included in the resin substrate are coupled via the wire bonding wiring.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

First Embodiment

A first embodiment of a resin substrate and an ultrasonic sensor according to the present invention will be described with reference to the accompanying drawings. The embodiment shows an example of using the ultrasonic sensor mounted on a vehicle.

Figure 1A:
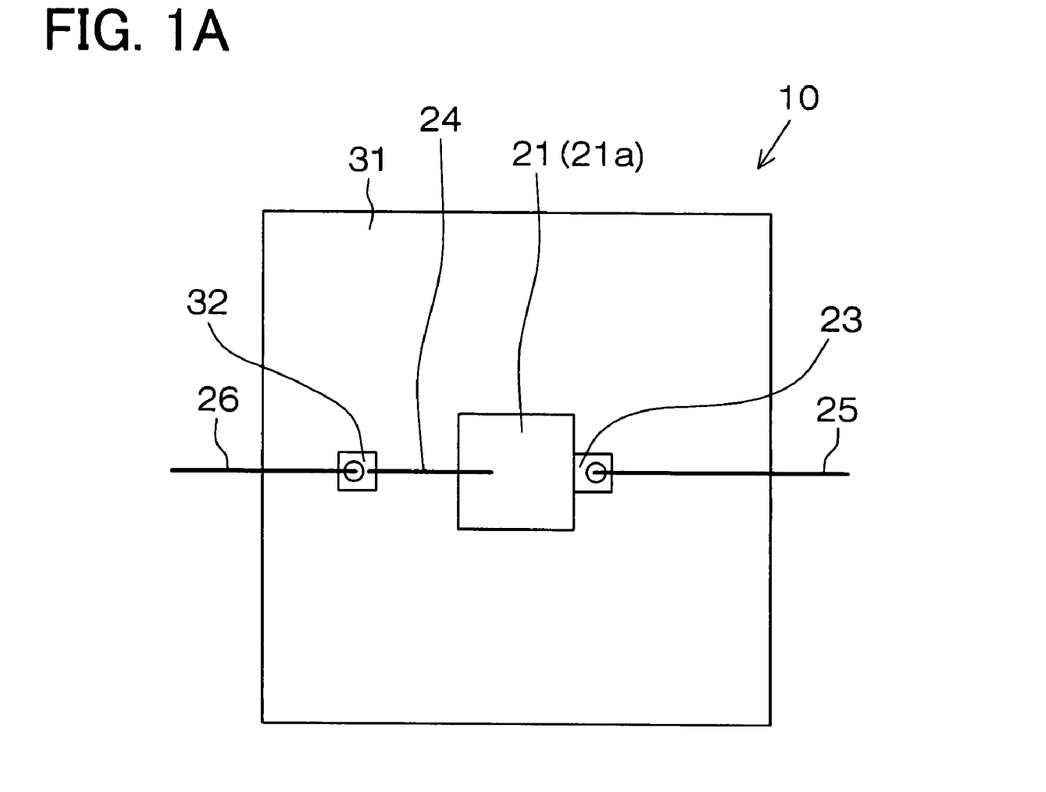
FIGS. 1A and 1B are explanatory diagrams of a resin substrate and an ultrasonic sensor according to a first embodiment.
Figure 1B:
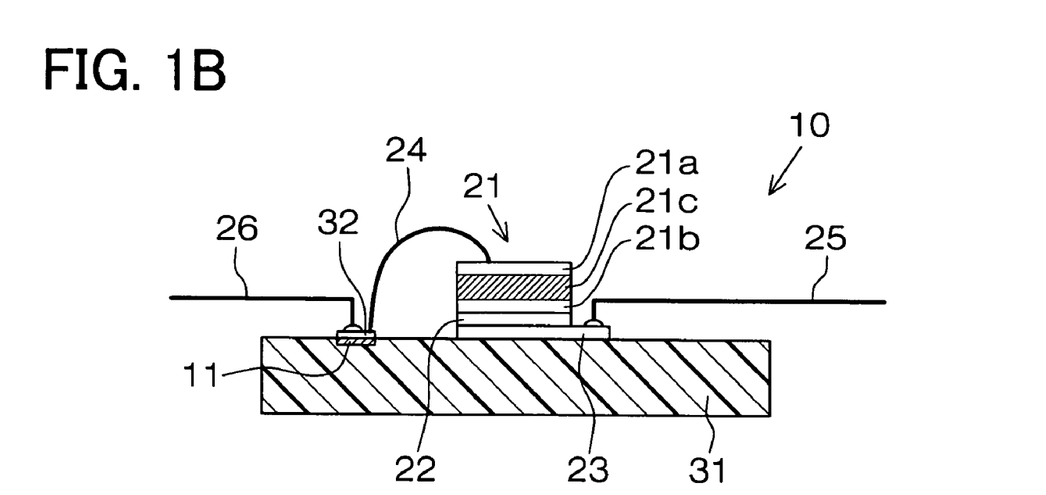
Figure 2:
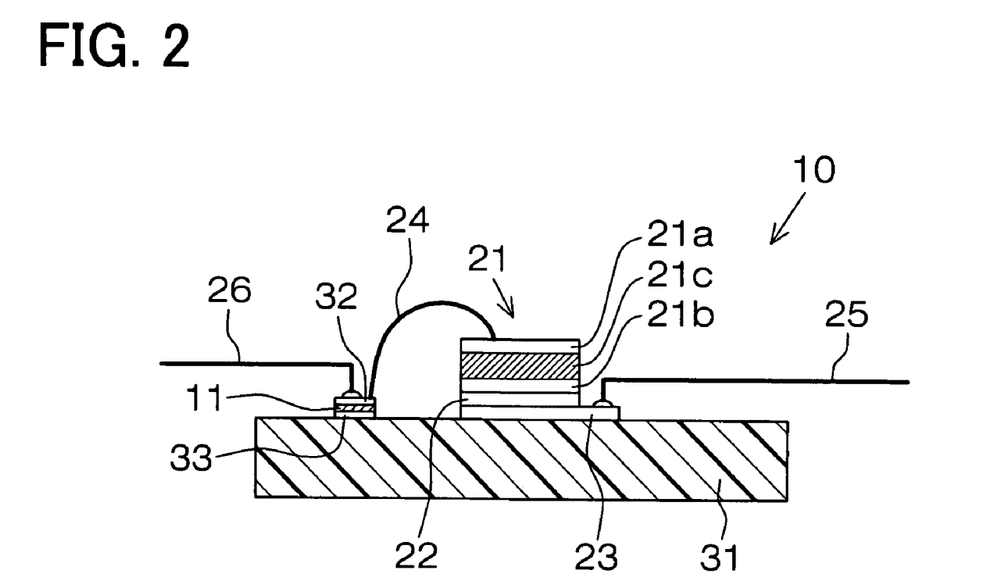
FIG. 2 is a sectional explanatory diagram showing an example of changing a method of mounting a pad on the resin substrate.

FIGS. 1A and 1B are explanatory diagrams of the resin substrate and the ultrasonic sensor according to the first embodiment. FIG. 1A is a top view of the resin substrate and the ultrasonic sensor according to the first embodiment viewed from an ultrasonic oscillator. FIG. 1B is a sectional view of FIG. 1A. FIGS. 2 and 3 are sectional explanatory diagrams showing examples of changing a method of mounting a pad on the resin substrate. The drawings are partly enlarged or omitted for purposes of illustration.

As shown in FIGS. 1A and 1B, an ultrasonic sensor 10 includes a resin substrate 31 and an ultrasonic oscillator 21 that is provided approximately at the center of a component side of the resin substrate 31 and generates and detects an ultrasonic wave. The ultrasonic oscillator 21 is formed by sandwiching a piezoelectric substance 21c made of, e.g., lead zirconium titanate (PZT) between an upper electrode 21a and a lower electrode 21b. The lower electrode 21b is mounted on the resin substrate 31. That is, the lower electrode 21b is electrically connected to an electrode 23 plated on the component side of the resin substrate 31 via a conductive adhesive 22. The lead zirconium titanate (PZT) features a large piezoelectric constant, making it possible to transmit a large ultrasonic wave and receive a small ultrasonic wave, and fabricate a sensitive ultrasonic sensor.

A resin body of the resin substrate 31 is formed like a flat plate using a polycarbonate resin, i.e., the same material as for a car bumper, for example. The component side of the resin substrate 31 is provided with a pad 11 adjacent to the ultrasonic oscillator 21. The pad 11 is used for metal wiring based on wire bonding. The pad 11 is made of a hard metal material excellent in conductivity and heat resistance such as stainless steel, and Al or Al alloy, for example. The resin body of the resin substrate 31 is formed as a single piece through insert molding by pouring a melted resin. Through this process (i.e., insert molding), the pad 11 is provided for the component side of the resin substrate 31.

An electrode layer 32 is formed on the surface of the pad and is made of Al or Au excellent in conductivity. The electrode layer 32 can be formed in the same process as for the electrode 23. When the pad 11 is made of Al or Al alloy, the wire bonding wiring is available as is. The electrode layer 32 need not be formed on the surface.

The pad 11 is made of the hard material excellent in conductivity and heat resistance and therefore enables metal wiring based on the wire bonding. A bonding wire 24 is used for wiring between the pad 11 (electrode layer 32) and the upper electrode 21a of the ultrasonic oscillator 21. A lead wire 26 is connected electrically. The lead wire 25 is electrically connected to the lower electrode 21b of the ultrasonic oscillator 21 via the electrode 23. The lead wires 25 and 26 are used to supply a drive current to the ultrasonic oscillator 21 or transmit a voltage signal thereto.

Various methods other than the insert molding can be used to provide the pad 11 for the component side of the resin substrate 31. As shown in FIG. 2, for example, it may be preferable to prefabricate the pad 11 having the electrode layer 32. The pad 11 may be bonded to the component side of the resin substrate 31 using an adhesive 33. A recess can be formed in the component side for embedding the pad 11. The pad 11 can be bonded in the recess.

Figure 3A:
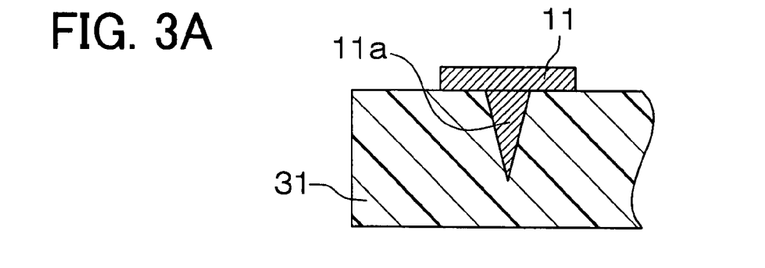
FIGS. 3A to 3E are sectional explanatory diagrams showing an example of changing a method of mounting a pad on the resin substrate.

As shown in FIGS. 3A to 3E, the pad may be fixed mechanically. FIGS. 3A to 3E show only the resin substrate 31 and the pad 11 by omitting the electrode layer 32. As shown in FIG. 3A, the pad 11 can include a needle-shaped fixing portion 11a. The pad 11 can be fixed simply by inserting the fixing portion 11a into the resin substrate 31.

Figure 3B:
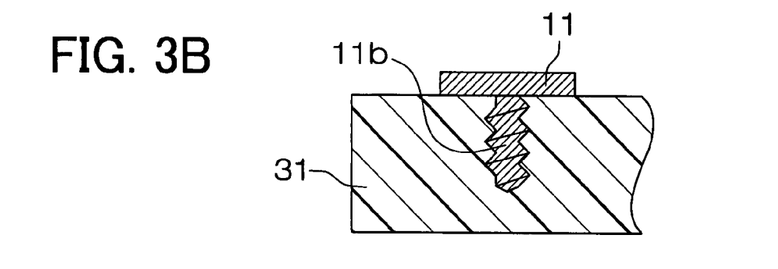

As shown in FIG. 3B, the pad 11 can include a screw portion 11b. The pad 11 can be fixed by screwing the screw portion 11b into the resin substrate 31. Since the screw portion 11b is used, the pad 11 can be firmly fixed to the pad 11 and decreases a possibility of being removed.

Figure 3C:
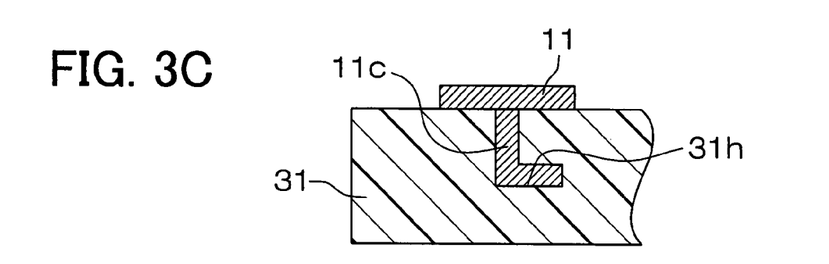

As shown in FIG. 3C, a bent groove portion 31h can be formed in the resin substrate 31. A bent portion 11c of the pad 11 can be inserted into the groove portion 31h. The bent portion 11c may be prefabricated on the pad 11. Alternatively, a liquid resin may be filled into the groove portion 31h. A flat portion of the pad 11 may be placed on the liquid resin so as to be formed as a single piece. The bent portion 11c engages with the groove portion 31h and decreases a possibility of removing the pad 11.

Figure 3D:
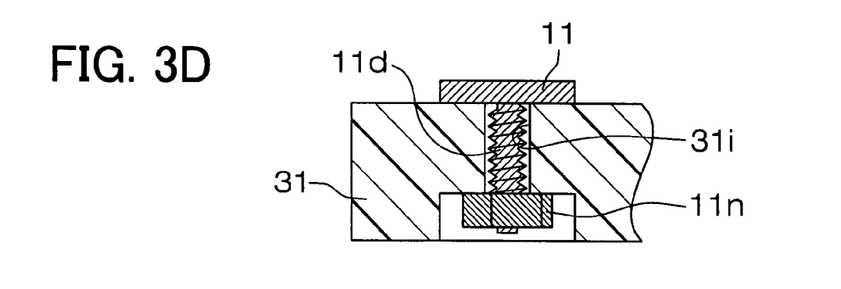
Figure 3E:
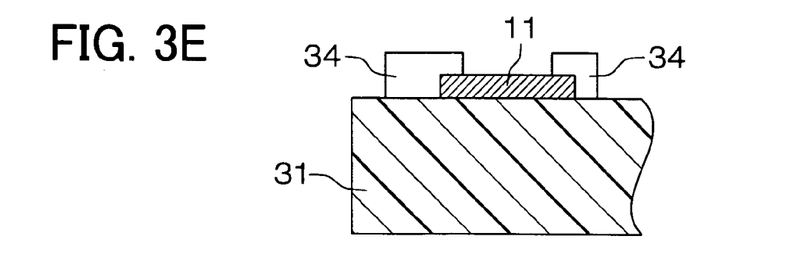

As shown in FIG. 3D, a through-hole 31i can be formed in the resin substrate 31. The pad 11 can be provided with a bolt portion 11d to be tightened with a nut 11n. As shown in FIG. 3E, a fastening portion 34 can be formed on the component side of the resin substrate 31 so as to fix the pad 11. The fastening portion 34 can fix the pad 11 by fastening its edges.

Here, the screw portion 11b, the bent portion 11c, and the bolt portion 11d can be referred to as a protruding portion.

The pad 11 as shown in FIGS. 3A through 3C may be used for the insert molding. In such case also, the fixing portion extending in a thickness direction of the resin substrate 31 can decrease a possibility of removing the pad 11 from the resin substrate 31 compared to the flat-shaped pad 11.

The pad 11 can use hard materials excellent in conductivity and heat resistance including not only metal materials but also a carbon or glass material whose surface is plated with Au, for example. The surface of the pad 11, i.e., the upper side, which is opposite to the lower side facing the resin body, may be higher than, lower than, or level with the component side of the resin substrate 31 under the condition that the electrode layer 32 is externally exposed to be capable of wire bonding wiring. The resin substrate 31 may be available as a printed wiring board generally used for semiconductor devices.

The ultrasonic sensor 10 having the resin substrate 31 according to the above-mentioned embodiment can be used as an ultrasonic sensor for vehicle when attached to a bumper 40 (FIG. 6) in the same manner as that described in a third embodiment later. The ultrasonic sensor 10 is attached to the bumper 40 with the resin substrate 31 exposed externally so that the ultrasonic oscillator 21 is placed inside a vehicle.

The resin substrate 31 is made of polycarbonate resin, i.e., the material of the bumper 40, and can make the ultrasonic sensor 10 less noticeable. The elaborately designed ultrasonic sensor 10 can be manufactured and ensure the beauty of the bumper 40.

The ultrasonic sensor 10 transmits the vibration of an ultrasonic wave generated from the ultrasonic oscillator 21 to the outside of the vehicle via the resin substrate 31. The ultrasonic oscillator 21 receives the ultrasonic wave reflected on an obstacle via the resin substrate 31. The ultrasonic wave received by the ultrasonic oscillator 21 is converted into a voltage signal.

A circuit device (not shown) is electrically connected to the ultrasonic oscillator 21 via the lead wires 25 and 26. The device is electrically connected to an ECU and performs operations based on a voltage signal output from the ultrasonic oscillator 21. For example, the device finds a time difference or a phase difference between the transmitted and received ultrasonic waves, making it possible to measure a distance to an obstacle, for example. The ultrasonic sensor 10 can be used for only reception by separately preparing an additional ultrasonic wave transmission device for transmitting an ultrasonic wave to an obstacle.

According to the embodiment, the ultrasonic oscillator 21 and the resin substrate 31 are rectangular. These members are not limited to these shapes and may be circular or polygonal, for example. The pad 11 may have any shape of surface where the wire bonding is available. The same applies to second and third embodiments.

Effects of the First Embodiment (1) The component side of the resin substrate 31 includes the pad 11 capable of wire bonding wiring. It is possible to mount a device such as the ultrasonic oscillator 21 that requires the wire bonding wiring. Materials for forming the pad 11 can include hard metal materials excellent in conductivity and heat resistance. Al or Al alloy is usable for the wire bonding wiring as is without forming the electrode layer 32. These materials are inexpensive and therefore preferable. A low conductive material can be used for the pad 11 by forming the conductive electrode layer 32 on the surface of the pad 11.

(2) The pad 11 can be attached to the resin substrate 31 in various ways.

(i) When the resin substrate 31 is formed, the insert molding can be used to attach the pad 11 to the component side of the resin substrate 31 and eliminate a process of attaching the pad 11 to the resin substrate 31. The pad 11 can be formed integrally.

(ii) The pad 11 can be bonded to the component side of the resin substrate 31. The pad 11 can be easily mounted and positioned.

(iii) The pad 11 can be provided with the portion projecting from the rear surface for the wire bonding such as the screw portion 11b, the bent portion 11c, or the bolt portion 11d. The projecting portion fixes the pad 11 in the thickness direction of the resin substrate 31. The projecting portion can firmly fix the pad 11 and decrease a possibility of removing it from the resin substrate 31.

(3) The surface of the pad 11 can be formed flush with the component side of the resin substrate 31. Even when the wire bonding is misaligned, a probe does not fall into a step between the pad surface and the resin substrate's component side. The electrode layer 32 can be formed on the surface of the pad 11 in the same process as for forming another electrode 23 on the resin substrate's component side.

(4) The resin substrate 31 can be formed of polycarbonate resin used for a vehicle bumper. The polycarbonate resin is solid and weather-resistant and can be appropriately used for the onboard ultrasonic sensor 10, for example.

(5) The ultrasonic sensor 10 uses the resin substrate 31 and includes the ultrasonic oscillator 21. Since the resin substrate 31 is less rigid, a resonance frequency can be reduced. Since the wire bonding wiring is available, the ultrasonic oscillator 21 and the ultrasonic sensor can be miniaturized.

(6) The ultrasonic sensor 10 can be provided for the bumper 40 and therefore can be mounted on a vehicle. The ultrasonic sensor 10 can be appropriately used as a sensor for detecting an obstacle ahead of the vehicle.

Second Embodiment

A second embodiment of the ultrasonic sensor according to the present invention will be described with reference to the accompanying drawings.

Figure 4A:
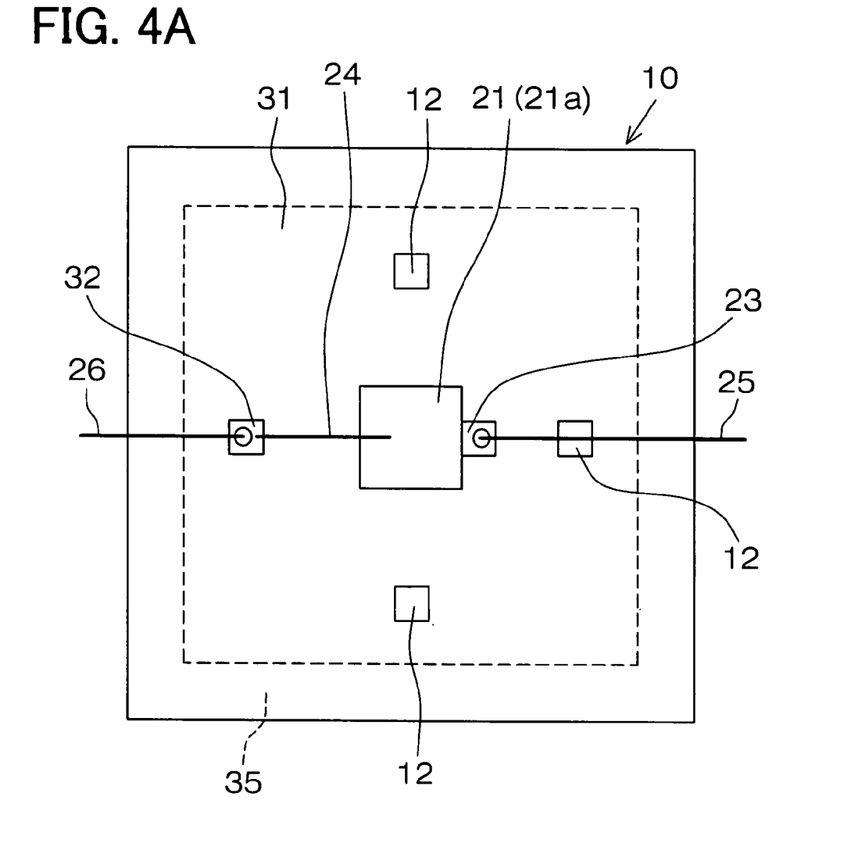
FIGS. 4A and 4B are explanatory diagrams of a resin substrate and an ultrasonic sensor according to a second embodiment.
Figure 4B:
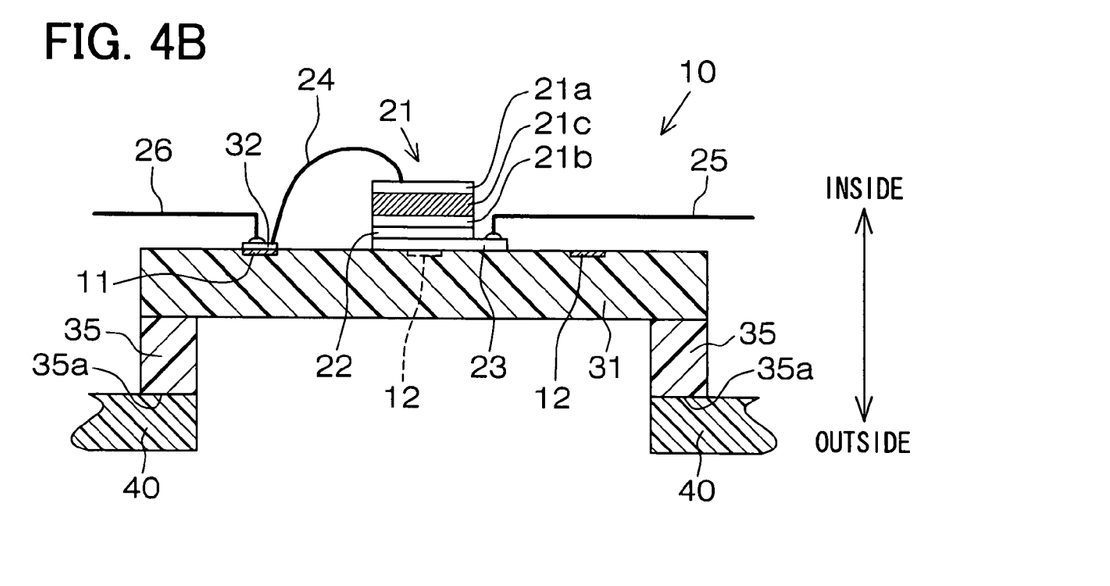
Figure 5A:
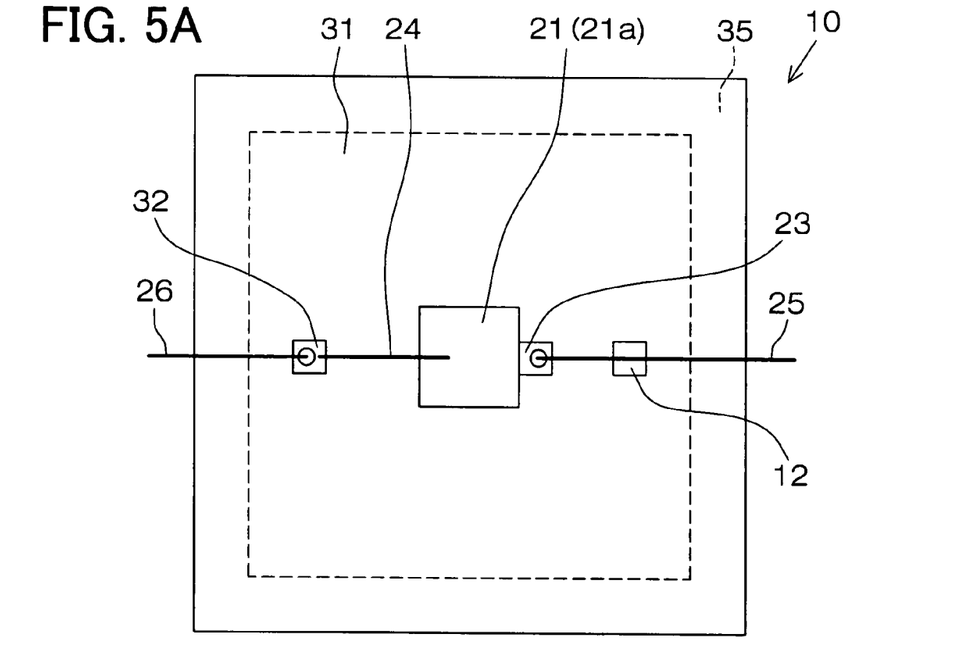
FIGS. 5A and 5B are top explanatory diagrams showing an example of changing a pad arrangement position.
Figure 5B:
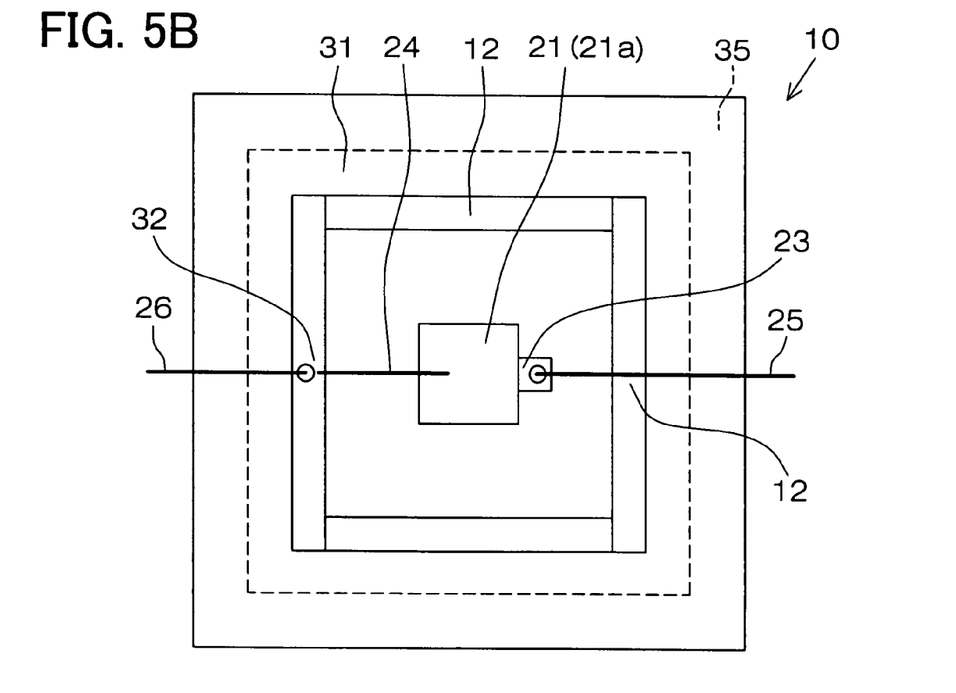

FIGS. 4A and 4B are explanatory diagrams of a resin substrate and an ultrasonic sensor according to the second embodiment. FIG. 4A is a top view of the resin substrate and the ultrasonic sensor according to the second embodiment viewed from an ultrasonic oscillator. FIG. 4B is a sectional view of FIG. 4A. FIGS. 5A and 5B are top explanatory diagrams showing an example of changing a pad arrangement position.

The depth (i.e., rear side) of FIG. 4A and the bottom of FIG. 4B indicate the exterior of the vehicle. The mutually corresponding parts in the first and second embodiments are designated by the same reference numerals and a detailed description is omitted for simplicity.

The second embodiment differs from the first in that a vibration amplification member 35 and a dummy pad 12 are provided. As shown in FIGS. 4A and 4B, the vibration amplification member 35 supports the outside periphery of the resin substrate 31 in a beam-like structure and is attached on the bumper 40. The vibration amplification member 35 is deformed by transmitted and received ultrasonic waves and amplifies the vibration of the resin substrate 31.

As shown in FIG. 4A, the vibration amplification member 35 like a square frame is provided approximately vertically around an outside periphery of the surface opposite to the component side provided with the ultrasonic oscillator 21 of the resin substrate 31.

The vibration amplification member 35 is made of a flexible material such as resin and is mounted on the bumper 40 at an edge face 35a. The vibration amplification member 35 may be formed independently of the resin substrate 31 and may be attached to it. The vibration amplification member 35 may be formed integrally with the resin substrate 31. In this manner, the resin substrate 31 is fit with the vibration amplification member 35 along the outside periphery and is formed like a beam supported by the bumper 40.

When the resin substrate 31 receives an ultrasonic wave in this configuration, a vibration is transmitted to the vibration amplification member 35. The edge is repeatedly bent toward the component side. The bend amplifies the vibration of the resin substrate 31 and increases the vibration transmitted to the ultrasonic oscillator 21. The sensitivity of the ultrasonic sensor 10 can be improved.

The component side of the resin substrate 31 includes not only the pad 11 but also three dummy pads 12 having no wiring. The dummy pad 12 requires no wiring and therefore eliminates the need for forming the electrode layer 32. Of the three dummy pads 12, one is symmetric to the pad 11 around the ultrasonic oscillator 21. The other two are equally distant from the pad 11 and form a line approximately perpendicular to a line formed by the pad 11 and the opposite dummy pad 12. The pad 11 and the dummy pads 12 are provided symmetrically with respect to the ultrasonic oscillator 21.

Since the pad 11 and the dummy pads 12 are symmetrically arranged around the ultrasonic oscillator 21, the weight of the resin substrate 31 can be balanced symmetrically around the ultrasonic oscillator 21. The resin substrate 31 can help prevent a torsion mode in a vibration along the thickness direction of the resin substrate 31 and can transmit a stable, strong vibration to the ultrasonic oscillator 21.

The dummy pad 12 just needs to be provided so as to prevent a torsion mode in the vibration along the thickness direction of the resin substrate 31. As shown in FIG. 5A, for example, the dummy pad 12 may be provided only for a position symmetrical to the pad 11.

As shown in FIG. 5B, the pad 11 and the dummy pads 12 can be shaped into belts parallel to the outside periphery of the resin substrate 31 so as to enclose the ultrasonic oscillator 21. This configuration increases weights of the pad 11, the dummy pads 12, and the resin substrate 31. A resonance frequency can be reduced.

The pad 11 and the dummy pad 12 can be arranged at any positions as long as the weight of the resin substrate 31 is balanced so as to be free from a torsion mode in the vibration along the thickness direction of the resin substrate 31. For example, the pad 11 and the dummy pad 12 can be arranged along a diagonal line of the resin substrate 31. The dummy pad 12 requires no wiring and may be made of any material and may be available in any shape.

Effects of the Second Embodiment (1) The vibration amplification member 35 supports the resin substrate 31 like a beam along the outside periphery of the resin substrate 31 and is attached to the bumper 40 at the edge face 35a. The vibration amplification member 35 is deformed by a vibration due to a transmitted and received ultrasonic wave and amplifies the vibration of the resin substrate 31. The vibration transmitted to the ultrasonic oscillator 21 increases. The ultrasonic sensor sensitivity can be improved.

(2) The dummy pad 12 is provided for the component side of the resin substrate 31 opposite the pad 11 symmetrically around the ultrasonic oscillator 21 so as to balance the weight of the resin substrate 31 without hindering a vibration along the thickness direction. The resin substrate 31 can help prevent a torsion mode in a vibration along the thickness direction of the resin substrate 31 and can transmit a stable, strong vibration to the ultrasonic oscillator 21.

Third Embodiment

Figure 6:
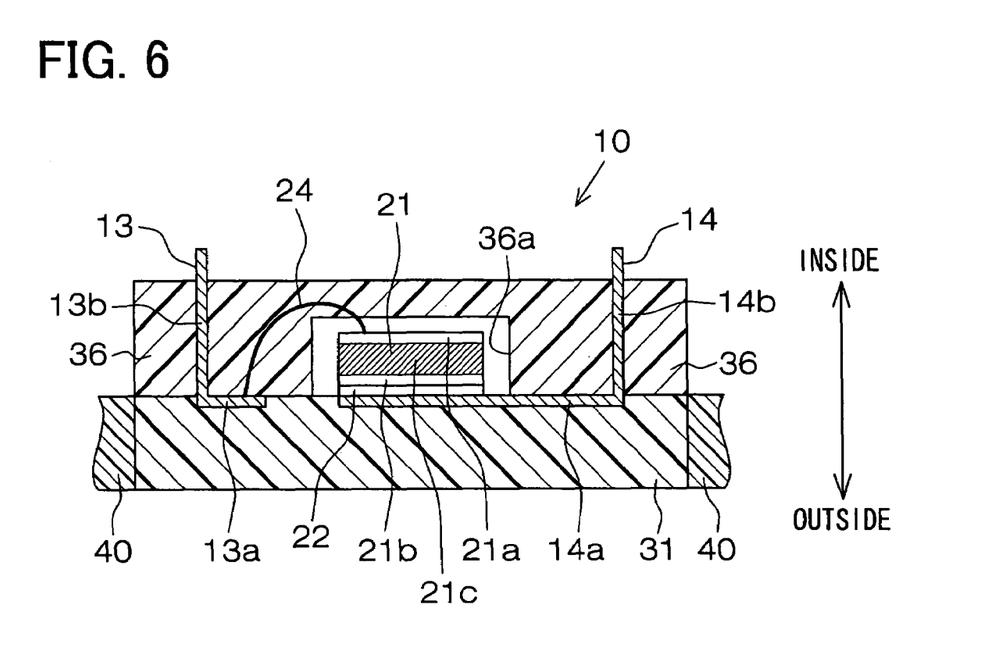
FIG. 6 is an explanatory diagram of an ultrasonic sensor formed by molding according to a third embodiment.
Figure 7:
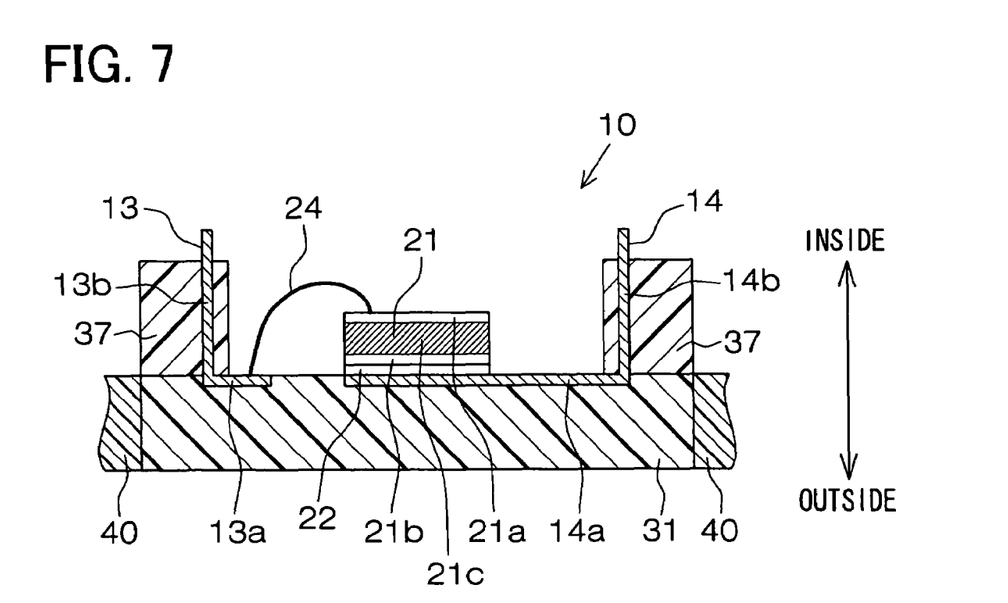
FIG. 7 is an explanatory diagram of an ultrasonic sensor formed by insert molding.
Figure 8:
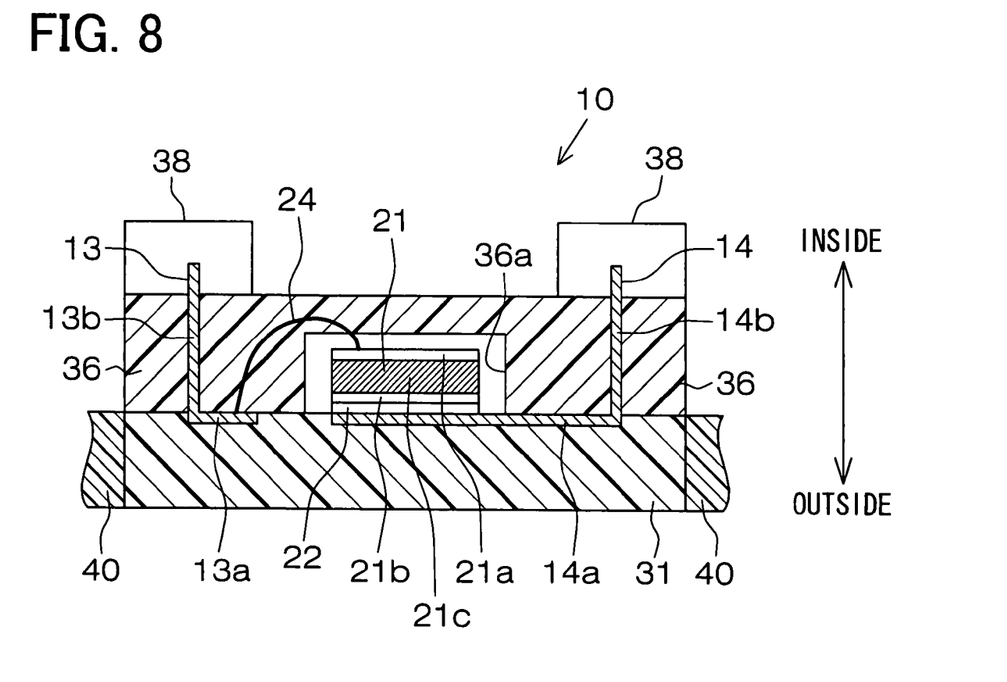
FIG. 8 is an explanatory diagram of an ultrasonic sensor having a connector.

A third embodiment of the ultrasonic sensor according to the invention will be described with reference to the accompanying drawings. FIG. 6 is an explanatory diagram of the ultrasonic sensor formed by molding according to the third embodiment. FIG. 7 is an explanatory diagram of the ultrasonic sensor formed by insert molding. FIG. 8 is an explanatory diagram of the ultrasonic sensor having a connector. The mutually corresponding parts in the first and third embodiments are designated by the same reference numerals and a detailed description is omitted for simplicity.

As shown in FIG. 6, the ultrasonic sensor according to the embodiment provides the ultrasonic oscillator 21 for a space portion 36a in a molded mold member 36. The ultrasonic sensor according to the embodiment is attached to a fitting portion bored through the bumper 40 so as to support the sides of the resin substrate 31. The ultrasonic oscillator 21 faces toward the inside of the vehicle. The resin substrate 31 is exposed to the outside.

A pad 13 is wire-bonded to the upper electrode 21a of the ultrasonic oscillator 21. An electrode 14 is electrically connected to the lower electrode 21b of the ultrasonic oscillator 21. Ends of the pad 13 and the electrode 14 are exposed from the surface of the mold member 36 to the vehicle inside.

The pad 13 includes a pad portion 13a and a lead portion 13b. The pad portion 13a is attached to the resin substrate 31 and is wired through wire bonding. The lead portion 13b is formed approximately perpendicularly to the end of the pad portion 13a. The pad 13 works as a wire bonding pad and a lead wire for connection between the pad and an external wiring. The pad 13 may be made of an Al alloy and may be provided with an electrode layer on the surface. The pad portion 13a may be shaped similarly to the pad 11 in FIGS. 3A to 3E.

The electrode 14 includes a connection portion 14a and a lead portion 14b. The connection portion 14a is attached to the resin substrate 31 and is electrically connected to the lower electrode 21b. The lead portion 14b is formed approximately perpendicularly to the end of the connection portion 14a. The electrode 14 works as an electrode electrically connected to the lower electrode 21b and a lead wire for connection between the electrode and an external wiring.

The ultrasonic oscillator 21 is placed in the space portion 36a of the mold member 36 and can be protected against an external load. A gel material can be filled in the space portion 36a. The gel material attenuates an ultrasonic wave transmitted from the ultrasonic oscillator 21 to the mold member 36. The ultrasonic wave intensely transmitted to the resin substrate 31. A noise can be reduced. The ultrasonic wave detection sensitivity can be improved.

As shown in FIG. 7, insert molding can be used to embed the lead portion 13b of the pad 13 and the lead portion 14b of the electrode 14 in an insert portion 37. A small quantity of resin can be used to protect the lead portions 13b and 14b.

As shown in FIG. 8, one ends of the pad 13 and the electrode 14 are exposed from the mold member 36 and can be each provided with a connector 38. This configuration facilitates connection to an external wiring. The connector 38 can also be provided for the ultrasonic sensor according to the configuration in FIG. 7.

Effects of the Third Embodiment (1) The ultrasonic oscillator 21 includes the pad 13 and the electrode 14 whose lead portions 13b and 14b are exposed and embedded. The ultrasonic oscillator 21 is placed in the space portion 36a of the molded mold member 36 and can be protected against an external load.

A gel material can be filled in the space portion 36a. The gel material attenuates an ultrasonic wave transmitted from the ultrasonic oscillator 21 to the mold member 36. The ultrasonic wave is intensely transmitted to the resin substrate 31. A noise can be reduced. The ultrasonic wave detection sensitivity can be improved.

(2) The pad 13 includes a pad portion 13a and a lead portion 13b. The pad portion 13a is attached to the resin substrate 31 and is wired through wire bonding. The lead portion 13b is formed approximately perpendicularly to the end of the pad portion 13a. The pad 13 works as a wire bonding pad and a lead wire for connection between the pad and an external wiring. No lead wire needs to be connected.

(3) One ends of the pad 13 and the electrode 14 are exposed from the mold member 36 and can be each provided with a connector 38. This configuration facilitates connection to an external wiring.

Figure 9:
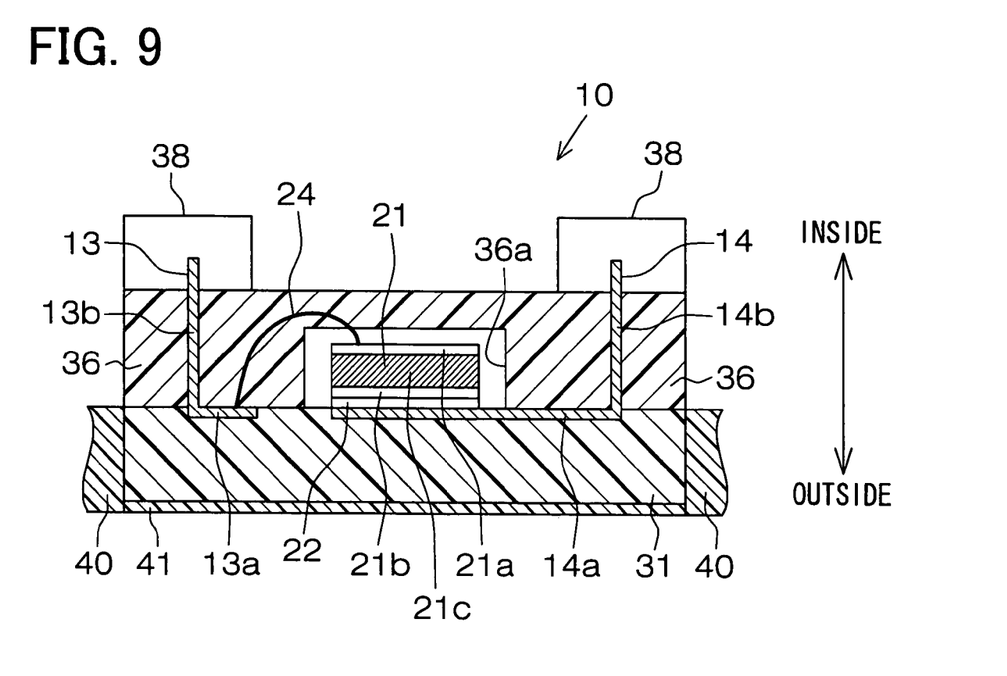
FIG. 9 is an explanatory diagram of an ultrasonic sensor according to another embodiment.

Other Embodiments (1) As shown in FIG. 9, the surface of the resin substrate 31 to the vehicle outside may be provided with a plate-shaped protector 41 whose color is similar to the bumper 40. Since the color of the protector 41 is similar to the bumper 40, the configuration can make the ultrasonic sensor 10 less noticeable. The elaborately designed ultrasonic sensor 10 can be manufactured and ensure the beauty of the bumper 40.

For example, the protector 41 can be made of a polycarbonate resin, i.e., the same material as the bumper 40. The protector 41 may be shaped into a plate and bonded to the resin substrate 31. Alternatively, the protector 41 may be formed by applying a liquid resin and hardening it later. The protector 41 may be formed as part of the bumper 40. The resin substrate 31 may be formed integrally with the bumper 40.

(2) The ultrasonic sensor 10 may be attached to the bumper 40 so that the ultrasonic oscillator 21 faces toward the vehicle outside. In this case, a cover needs to be provided to protect the ultrasonic oscillator 21. This configuration forms the ultrasonic oscillator 21 faced to the vehicle outside and can transmit an ultrasonic wave without using the resin substrate 31. The ultrasonic wave detection sensitivity can be improved. The cover can be meshed or shaped to have many small holes so that hindrance to the ultrasonic wave transmission can be minimized. No cover may be needed when the ultrasonic sensor 10 is mounted on a robot used in a room, for example.

(3) The ultrasonic sensor 10 can be mounted on vehicle members other than the bumper 40. For example, the ultrasonic sensor 10 can be mounted on a headlamp cover. According to this configuration, the ultrasonic sensor 10 can reliably detect an ultrasonic wave reflected on an obstacle without being hindered by part of the vehicle. The ultrasonic sensor 10 can be effectively used as an obstacle sensor.

The ultrasonic sensor 10 can be mounted on the other members according to various requirements. When the ultrasonic sensor 10 is used as an obstacle sensor for vehicle sides, for example, it can be mounted on a turn signal lamp cover or a side mirror. When the ultrasonic sensor 10 is used as an obstacle sensor for the vehicle rear, it can be mounted on a cover of a tail lamp or a back-up lamp.

Aspects of the subject matter described herein are set out in the following clauses.

As a first aspect, a resin substrate is provided as follows. A resin body is configured using an insert molding and the resin body has a component side for mounting a component. A pad is disposed to the component side of the resin body and provided for wire bonding wiring. Here, the pad is attached to the component side of the resin body through the insert molding.

According to the above aspect, the component side of the resin substrate is provided with the pad capable of wire bonding wiring. It is possible to mount a device that requires wire bonding wiring. The insert molding is used to form the resin substrate and attach the pad to the component side of the resin substrate. There is no need for a process of attaching the pad to the resin substrate. The pad can be formed integrally.

In the above resin substrate, the pad may include a portion projecting toward inside of the resin body. The portion may be embedded in the resin body to fix the pad.

According to the above structure, the pad includes a portion projecting from the rear side opposite to the side for the wire bonding. The protruding portion is embedded in the resin body or resin substrate to fix the pad to the resin substrate's component side. The projecting portion can fix the pad in the thickness direction of the resin substrate. The projecting portion can firmly fix the pad and decrease a possibility of removing it from the resin body or the resin substrate.

As a second aspect, a resin substrate is provided as follows. A resin body is included and has a component side for mounting a component. A pad is disposed to the component side of the resin body and provided for wire bonding wiring. Here, the pad is bonded to the component side of the resin body.

According to the above structure, the component side of the resin substrate is provided with the pad capable of wire bonding wiring. It is possible to mount a device that requires wire bonding wiring, similarly. The pad is bonded to the component side of the resin substrate. The pad can be easily mounted and positioned.

In either of the above resin substrates, the pad may be made of a metal material. Thus, materials for forming the pad can include hard metal materials excellent in conductivity and heat resistance.

In either of the above resin substrates, the metal material may be Al or Al alloy. Thus, the material enables wire bonding wiring as is without forming an electrode layer and is cost-effective.

In either of the above resin substrates, a conductive electrode layer may be formed on the pad surface. Thus, a low conductive material can be used for the pad by forming the conductive electrode layer on the pad surface.

In either of the above resin substrates, the pad has a first side facing the resin body and a second side opposite to the first side, and the second side of the pad may be level with the component side of the resin body. Thus, the second side of the pad (i.e., the pad surface) can be formed to be level with the resin substrate's component side. Even when the wire bonding is misaligned, a probe does not fall into a step between the pad surface and the resin substrate's component side. In contrast, if an electrode layer is formed on the surface of the pad, the electrode layer can be made in the same process as for forming another electrode on the resin substrate's component side.

In either of the above resin substrates, a conductive lead portion may be configured to protrude approximately perpendicularly from an end portion of the pad and outwardly of the resin body. Thus, no lead wire needs to be connected to the pad.

In either of the above resin substrates, the resin substrate may be made of polycarbonate resin. Thus, the resin substrate can be formed of polycarbonate resin used for a vehicle bumper. The polycarbonate resin is solid and weather-resistant and can be appropriately used for an onboard ultrasonic sensor, for example.

As yet another aspect, an ultrasonic sensor is provided as follows. An ultrasonic oscillator is included. Either of the above mentioned resin substrates is further included for mounting the ultrasonic oscillator. Here, the ultrasonic oscillator and the pad included in the resin substrate are coupled via the wire bonding wiring.

Here, either of the above resin substrates can reduce a resonance frequency. The resin substrate can be appropriately used for the ultrasonic sensor including the ultrasonic oscillator. Since the wire bonding wiring is available, the ultrasonic oscillator and the ultrasonic sensor can be miniaturized.

In the above ultrasonic sensor, the ultrasonic oscillator may be piezoelectric and may be formed by sandwiching a piezoelectric substance between one pair of electrodes. Wire bonding wiring may be provided between the pad and at least one electrode. Thus, the piezoelectric ultrasonic oscillator excellent in the detection sensitivity can be used with the wire bonding wiring provided.

The above ultrasonic sensor may further include a vibration amplification member. The vibration amplification member may support the resin substrate like a beam along an outside periphery of the resin substrate and is attached to a specified object at edges. The vibration amplification member may be deformed by a vibration due to a transmitted and received ultrasonic wave and amplifies the vibration of the resin substrate. Thus, the vibration transmitted to the ultrasonic oscillator increases, thereby improving the ultrasonic sensor sensitivity.

The above ultrasonic sensor includes a dummy pad. The dummy pad may be provided for the component side of the resin substrate opposite the pad symmetrically around the ultrasonic oscillator so as to balance the weight of the resin substrate without hindering a vibration along the thickness direction. Thus, the resin substrate can help prevent a torsion mode in a vibration along the thickness direction and can transmit a stable, strong vibration to the ultrasonic oscillator.

In the above ultrasonic sensor, the ultrasonic oscillator may be electrically connected to an embedded wire one end of which is exposed. The ultrasonic oscillator may be placed in a space portion of the molded mold member. Thus, the wiring and the ultrasonic oscillator can be protected against an external load.

In the above structure, a gel material may be filled in the space portion to attenuate an ultrasonic wave vibration. Thus, the gel material can attenuate an ultrasonic wave transmitted from the ultrasonic oscillator to the mold member. The ultrasonic wave can be intensely transmitted to the resin substrate. A noise can be reduced. The ultrasonic wave detection sensitivity can be improved.

The above ultrasonic sensor can include a connector for connection with an external wiring at one end of a wiring electrically connected to the ultrasonic oscillator. Thus, the ultrasonic sensor can be easily connected to an external wiring.

In the above ultrasonic sensor, the resin substrate can be attached to a vehicle bumper. Thus, the ultrasonic sensor can be provided for the bumper and therefore can be mounted on a vehicle. For example, the ultrasonic sensor can be appropriately used as a sensor for detecting an obstacle ahead of the vehicle.

It will be obvious to those skilled in the art that various changes may be made in the above-described embodiments of the present invention. However, the scope of the present invention should be determined by the following claims.

What is claimed is:

1. An ultrasonic sensor comprising:
an ultrasonic oscillator; and
a resin substrate including
    (i) a resin body configured by using an insert molding and having a component side provided for mounting the ultrasonic oscillator; and
    (ii) a pad disposed to the component side of the resin body for a wire bonding wiring, the pad being attached to the component side through the insert molding,
wherein the ultrasonic oscillator and the pad are coupled via the wire bonding wiring.

2. The ultrasonic sensor of claim 1,
wherein the ultrasonic oscillator is piezoelectric and includes a piezoelectric substance, and a pair of electrodes sandwiching the piezoelectric substance therebetween, and
wire bonding wiring is provided between the pad and at least one of the electrodes.

3. The ultrasonic sensor of claim 1, further comprising:
a vibration amplification member configured to support as a beam the resin substrate along an outside periphery of the resin substrate, the vibration amplification member being attached to a specified object at edges thereof, the vibration amplification member being deformed by a vibration due to a transmitted and received ultrasonic wave to amplify a vibration of the resin substrate.

4. The ultrasonic sensor of claim 3, further comprising:
a dummy pad disposed to the component side of the resin body, the pad and the dummy pad being symmetrical to each other with respect to the ultrasonic oscillator for balancing a weight of the resin substrate not to hinder a vibration along a thickness direction of the resin body.

5. The ultrasonic sensor of claim 1, further comprising:
a space portion provided for accommodating the ultrasonic oscillator inside of a mold member molded to embed a wiring electrically coupled with the ultrasonic oscillator, one end of the wiring being exposed externally.

6. The ultrasonic sensor of claim 5, wherein
the space portion is filled with a gel material to attenuate an ultrasonic wave vibration.

7. The ultrasonic sensor of claim 5, further comprising:
a connector for connection with an external wiring at the one end of the wiring electrically coupled with the ultrasonic oscillator.

8. The ultrasonic sensor of claim 1, further comprising:
the resin substrate is attached to a vehicle bumper.

9. An ultrasonic sensor including:
an ultrasonic oscillator; and
a resin substrate including
    (i) a resin body having a component side provided for mounting the ultrasonic oscillator; and
    (ii) a pad disposed to the component side of the resin body for a wire bonding wiring, the pad being bonded to the component side of the resin body,
wherein the ultrasonic oscillator and the pad are coupled via the wire bonding wiring.

10. The ultrasonic sensor of claim 9,
wherein the ultrasonic oscillator is piezoelectric and includes a piezoelectric substance, and a pair of electrodes sandwiching the piezoelectric substance therebetween, and
wire bonding wiring is provided between the pad and at least one of the electrodes.

* * * * *